US007926165B2

(12) United States Patent
Hong et al.

(10) Patent No.: US 7,926,165 B2
(45) Date of Patent: Apr. 19, 2011

(54) MICRO ANTENNA AND METHOD OF MANUFACTURING THE SAME

(75) Inventors: Young-tack Hong, Yongin-si (KR); Moon-chul Lee, Yongin-si (KR); In-sang Song, Yongin-si (KR); Sang-wook Kwon, Yongin-si (KR); Chang-won Jung, Yongin-si (KR); Eun-seok Park, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 188 days.

(21) Appl. No.: 11/712,526

(22) Filed: Mar. 1, 2007

(65) Prior Publication Data

US 2008/0072416 A1 Mar. 27, 2008

(30) Foreign Application Priority Data

Sep. 12, 2006 (KR) ........................ 10-2006-0088216

(51) Int. Cl.

| | |
|---|---|
| ***H01P 11/00*** | (2006.01) |
| ***H01Q 13/00*** | (2006.01) |
| ***H01Q 17/00*** | (2006.01) |
| ***H01Q 1/36*** | (2006.01) |
| ***H05K 3/36*** | (2006.01) |
| ***H01K 3/10*** | (2006.01) |

(52) U.S. Cl. ................ 29/600; 29/601; 29/830; 29/852; 343/895

(58) Field of Classification Search .................... 29/600, 29/601, 830, 852; 343/895, 700 MS; 427/58, 427/123

See application file for complete search history.

(56) References Cited

U.S. PATENT DOCUMENTS

| | | | | |
|---|---|---|---|---|
| 5,584,617 | A * | 12/1996 | Houser | 408/1 R |
| 2001/0032828 | A1 * | 10/2001 | Appelt et al. | 216/13 |
| 2003/0141600 | A1 * | 7/2003 | van der Windt | 257/774 |
| 2004/0027288 | A1 * | 2/2004 | Okubora et al. | 343/700 MS |
| 2005/0251997 | A1 * | 11/2005 | Homg et al. | 29/830 |
| 2006/0081982 | A1 * | 4/2006 | Huang et al. | 257/737 |
| 2006/0238420 | A1 * | 10/2006 | Jansen | 343/700 MS |

FOREIGN PATENT DOCUMENTS

JP 2004/213196 A 7/2004

* cited by examiner

*Primary Examiner* — A. Dexter Tugbang
*Assistant Examiner* — David P Angwin
(74) *Attorney, Agent, or Firm* — Sughrue Mion, PLLC

(57) ABSTRACT

A method of manufacturing a micro antenna is provided. The method includes forming a plurality of holes penetrating a first substrate, filling each of the plurality of holes with a conductive material to form a plurality of vertical conducting parts, forming a plurality of horizontal conducting parts on each of two different surfaces of the first substrate, wherein the each of the horizontal conducting parts is electrically connected to the corresponding vertical conducting parts, bonding the first substrate, on which the vertical conducting parts and the horizontal conducting parts have been formed, to a second substrate, and removing the first substrate to expose a whole structure of a 3D micro antenna which is formed on the second substrate and includes the vertical conducting parts and the horizontal conducting parts connected to each other.

13 Claims, 9 Drawing Sheets

MICRO ANTENNA AND METHOD OF MANUFACTURING THE SAME

CROSS-REFERENCE TO RELATED APPLICATIONS

This application claims priority from Korean Patent Application No. 10-2006-0088216 filed on Sep. 12, 2006 in the Korean Intellectual Property Office, the entire disclosure of which is incorporated herein by reference.

BACKGROUND OF THE INVENTION

1. Field of the Invention

Apparatuses and methods consistent with the present invention relate to a micro antenna and a method of manufacturing the same. More particularly, apparatuses and methods consistent with the present invention relate to a micro antenna and a method of manufacturing the same, by which a 3-dimensional (3-D) coil structure is formed on a first substrate, the first substrate is bonded to a second substrate, and the first substrate is removed with the 3-D coil structure left, so as to form the micro antenna above the second substrate.

2. Description of the Related Art

Antennas have various shapes and are manufactured using various methods. However, in a case of a micro antenna using Micro Electro Mechanical Systems (MEMS) technology, horizontal conducting parts are formed of a conductive material on a substrate using a mask. Next, vertical conducting parts are formed using the mask to be electrically connected to the horizontal conducting parts, and horizontal conducting parts are formed using the mask to be electrically connected to the vertical conducting parts. As a result, a 3-dimensional (3-D) coil structure is completed on the substrate. However, it is complicated and difficult to form vertical conducting parts very high using a method of forming and piling or building up a structure on each layer using a mask.

FIG. 1A is a perspective view illustrating a related art method of manufacturing a 3-D antenna. Referring to FIG. 1A, a first insulating layer is formed on an integrated circuit (IC) chip 2 which has been formed in advance. The first insulating layer is electrically connected to a seed metal pattern through electrodes 41 and 42 connected to the IC chip 2. The first insulating layer is electroplated using the seed metal pattern to form lower horizontal conducting parts 31. In other words, the first insulating layer is stacked on the IC chip 2 and then patterned. Next, the patterned areas of the first insulating layer are electroplated to form the lower horizontal conducting parts 31. Thereafter, a second insulating layer is formed, and a seed metal pattern connected to the lower horizontal conducting parts 31 is formed, and the second insulating layer is electroplated using the seed metal pattern to form upper horizontal conducting parts 32. As a result, an antenna 3 having a flat coil structure as shown in FIG. 1A may be manufactured.

FIG. 1B is a perspective view illustrating another related art method of manufacturing a 3-D antenna. In the coil structure illustrated in FIG. 1A, the lower horizontal conducting parts 31 are slantingly parallel with one another in a diagonal direction, and the upper horizontal conducting parts 32 are slantingly parallel with one another in an opposite direction to the diagonal direction. Also, the lower horizontal conducting parts 31 are electrically connected to the upper horizontal conducting parts 32. However, in the method illustrated in FIG. 1B, horizontal conducting parts 131 are formed on a lower surface of an IC chip 2 to be respectively parallel with horizontal conducting parts 132 formed on an upper surface of the IC chip 2. As a result, a coil structure 103 is completed.

In the above-described related art methods, an IC chip is formed, an insulating layer is formed of polyimide or the like on the IC chip, and lower horizontal conducting parts are formed on the insulating layer using electroplating, so as to realize an antenna. Next, an insulating layer is formed, and upper horizontal conducting parts are formed on the insulating layer using electroplating so as to manufacture a flat coil structure which is electrically connected. Thus, according to the above-described related art methods, insulating layers are required, and it is difficult to form a coil structure including high vertical conducting parts having square-like cross-sections. Also, an IC chip is formed in advance, and then the coil structure is formed on the IC chip using the above-described processes. Thus, a process of manufacturing the IC chip and a process of manufacturing a coil type antenna may affect each other.

In particular, technology for integrating several devices on a chip is required with the advent of System on Chip (SoC)-related technology. Thus, there is required a method of manufacturing an antenna device using an independent process which does not affect processes of manufacturing the devices and the IC chip. However, a conventional micro antenna and a method of manufacturing the conventional micro antenna do not satisfy such requirements.

SUMMARY OF THE INVENTION

Accordingly, the present general inventive concept has been made to address the above-mentioned problems, and an aspect of the present general inventive concept is to provide a method of manufacturing a micro antenna using a separate first substrate so as not affect processes of manufacturing devices, an integrated circuit (IC), etc., which can be formed on a second substrate, or so as not to damage devices, an IC, etc., which are formed in advance, and a micro antenna manufactured using the method.

Another aspect of the present general inventive concept is to provide a micro antenna having a 3-dimensional (3-D) coil structure, wherein the micro antenna is formed on a substrate according to simple design and process, and a method of manufacturing the micro antenna.

Another aspect of the present general inventive concept is to provide a micro antenna capable of covering a frequency of a wide area through only a change of a design for adjusting a number of turns of a 3-D coil structure having vertical conducting parts each having a thickness corresponding to a thickness of a first substrate, and a method of manufacturing the micro antenna.

According to an aspect of the present invention, there is provided a method of manufacturing a micro antenna, including: forming at least one hole penetrating a first substrate; forming at least one vertical conducting part in the at least one hole using a conductive material; forming at least one horizontal conducting part on different surfaces of the first substrate, wherein the at least one horizontal conducting part is electrically connected to the at least one vertical conducting part; bonding the first substrate on which the at least one vertical conducting part and the at least one horizontal conducting part have been formed to a second substrate; and removing the first substrate.

The conductive material may be filled in the at least one hole to form the at least one vertical conducting part. Here, filling is not limited to fully filling the at least one hole with the conductive material, but also contemplates that portions of the conductive material are vertically and electrically connected from an entrance of the at least one hole to an exit of the at least one hole.

A plated metal may be grown in the at least one hole using plating, and then portions of the first substrate and an outer surface of the plated metal may be removed using a planarizing process to form the at least one vertical conducting part.

The formation of the at least one horizontal conducting part may include: forming at least one first horizontal conducting part on an upper surface of the first substrate, wherein the at least one first horizontal conducting part is electrically connected to the at least one vertical conducing part; and forming at least one second horizontal conducting part on a lower surface of the first substrate, wherein the at least one second horizontal conducting part is electrically connected to the at least one vertical conducting part.

A first insulating pattern may be formed on the upper surface of the first substrate and then used as a mask to form the at least one first horizontal conducting part on the upper surface of the first substrate using a conductive material. A second insulating pattern may be formed on the lower surface of the first substrate and then used as a mask to form the at least one second horizontal conducting part on the lower surface of the first substrate using a conductive material.

A plurality of holes may be formed in two rows in the first substrate to be abreast with one another. Pairs of vertical conducting parts, which belong to different rows and diagonally face each other, may be electrically connected to each other on the upper surface of the first substrate. Pairs of vertical conducting parts, which belong to different rows and face one another, may be electrically connected to one another on the lower surface of the first substrate to form a coil structure in which the at least one vertical conducting part, the at least one first horizontal conducting part, and the at least one second horizontal conducting part are electrically connected to one another.

A first seed metal layer may be formed on the upper surface of the first substrate, a first photolithography etching pattern may be formed on the first seed metal layer, the first seed metal layer may be plated using the first photolithography etching pattern as a mask to form the at least one first horizontal conducting part, and portions of the first photolithography etching pattern and the first seed metal layer exposed underneath the first photolithography etching pattern may be removed.

A second seed metal layer may be formed on the lower surface of the first substrate, a second photolithography etching pattern may be formed on the second seed metal layer, and the second seed metal layer may be plated using the second photolithography etching pattern as a mask to form the at least one second horizontal conducting part, and portions of the second photolithography etching pattern and the second seed metal layer exposed underneath the second photolithography etching pattern may be removed.

Before forming the at least one holes in the first substrate, a second seed metal layer may be stacked on the lower surface of the first substrate. A photolithography etching pattern may be formed on an upper surface of the first substrate and then used as a mask to perform dry etching from the upper surface of the first substrate to a seed metal layer so as to form the at least one hole. Plating may be performed through the seed metal layer to fill the at least one hole with a conductive material so as to form the at least one vertical conducting part.

The method may further include forming at least one connection electrode necessary for bonding the first substrate including a 3-dimensional (3-D) coil structure formed of the conductive material to the second substrate on which devices, an IC, etc. may be formed.

The method may further include forming a cavity in a lower part of the first substrate so that the 3-D coil structure is separated from the second substrate.

According to another aspect of the present invention, there is provided a micro antenna manufactured using the method.

In the micro antenna, vertical and horizontal conducting parts may constitute the 3-D coil structure. The 3-D coil structure may be connected to a circuit on the second substrate while the first substrate is removed. Thus, the 3-D coil structure may operate as a micro antenna.

The micro antenna may lift away from the second substrate while being fixed to the second substrate. Thus, the micro antenna may have a high performance. Complicated and difficult processes are not required to form the 3-D coil structure. Also, the 3-D coil structure may be formed using the first substrate separate from the second substrate. Thus, processes for forming other devices may be facilitated and/or connection of the 3-D coil structure to a circuit including an antenna is facilitated. As a result, the circuit may be variously designed, and the antenna may be easily disposed.

BRIEF DESCRIPTION OF THE DRAWINGS

The above aspects and features of the present invention will be more apparent by describing certain exemplary embodiments of the present invention with reference to the accompanying drawings, in which.

DETAILED DESCRIPTION OF THE EXEMPLARY EMBODIMENTS

Figure 1A:
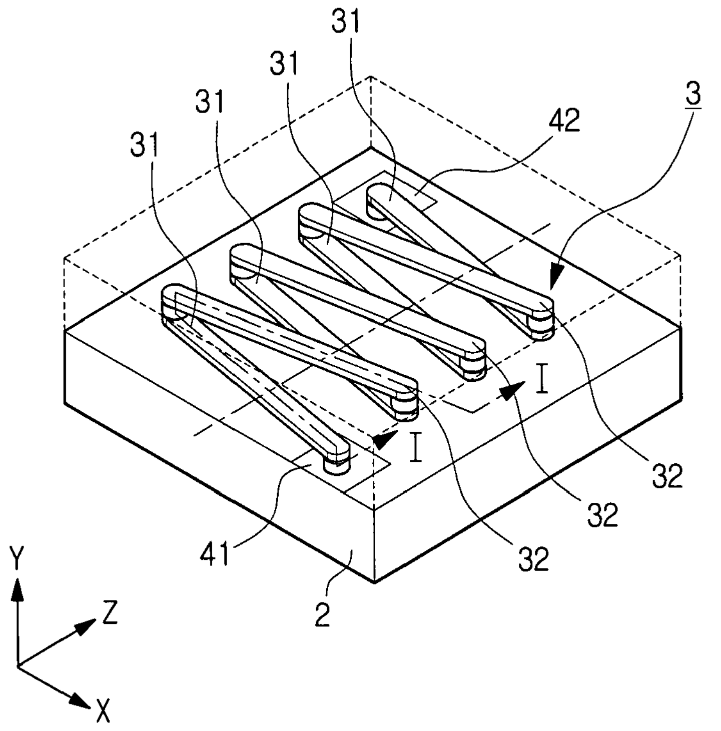
FIG. 1A (RELATED ART)
FIGS. 1A and 1B are perspective views illustrating related art methods of manufacturing a coil type antenna on a substrate.
Figure 1B:
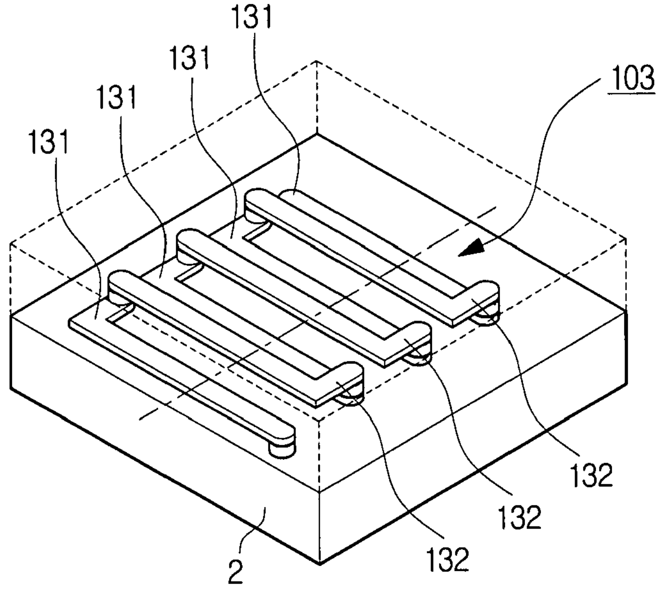
FIG. 1B (RELATED ART)

Certain exemplary embodiments of the present invention will be described in greater detail with reference to the accompanying drawings.

In the following description, same drawing reference numerals are used for the same elements even in different drawings. The matters defined in the description such as a detailed construction and elements are provided to assist in a comprehensive understanding of the invention. Thus, it is apparent that the present invention can be carried out without those defined matters. Also, well-known functions or constructions are not described in detail since they are not necessary to understand the invention.

Figure 2:
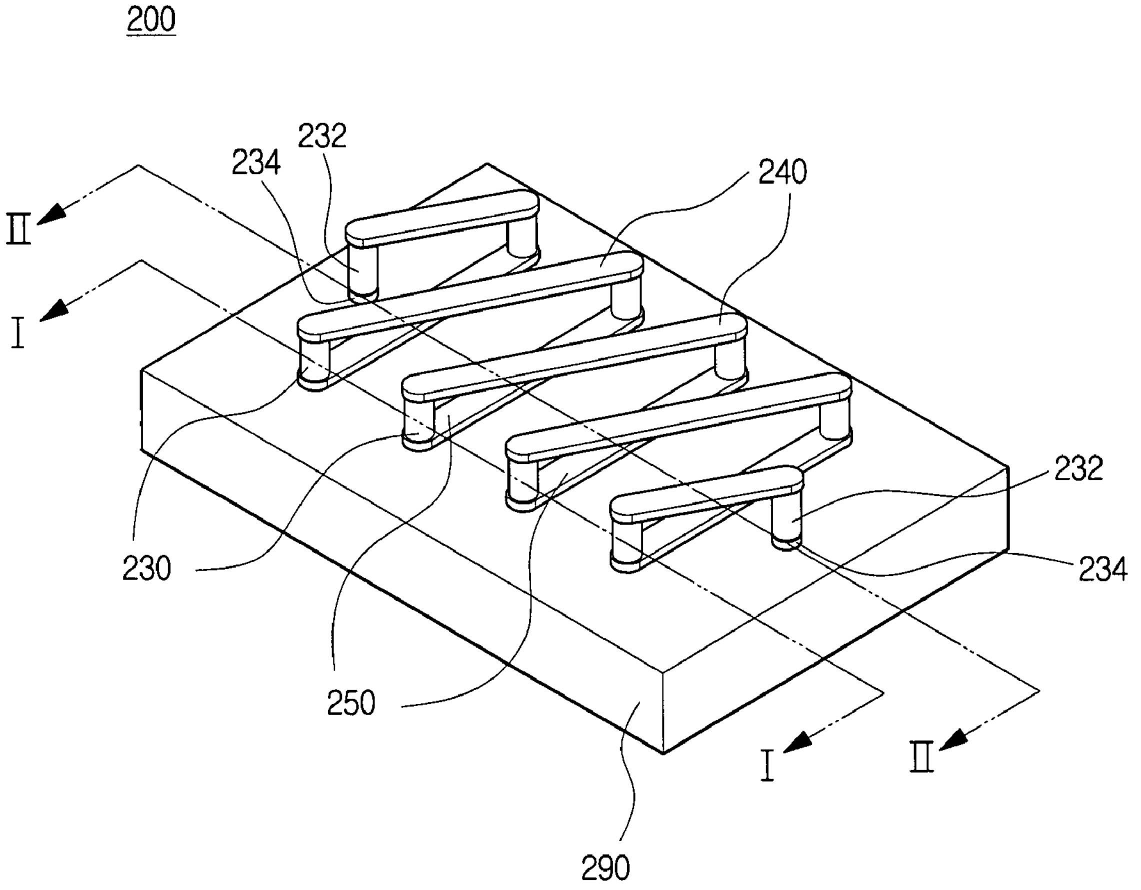
FIGS. 2 and 3 are perspective views illustrating micro antennas according to exemplary embodiments of the present invention.

FIG. 2 is a perspective view illustrating a micro antenna according to an exemplary embodiment of the present invention. Referring to FIG. 2, a micro antenna 200 includes a second substrate 290, electrode parts 234, vertical conducting parts 230 and 232, and horizontal conducting parts 240 and 250. The vertical conducting parts 230 and 232 are formed perpendicular to the second substrate 290 so that upper parts of the vertical conducting parts 230 and 232 are electrically connected to lower parts of the vertical conducting parts 230 and 232. The horizontal conducting parts 240 and 250 are formed horizontally with respect to the second substrate 290 so as to be electrically connected to the vertical conducting parts 230 and 232. As a result, a 3-dimensional (3-D) coil structure is realized.

The vertical conducting parts 230 and 232 may be formed using, for example, a plating method, a depositing method, etc. If the vertical conducting parts 230 and 232 are formed using the plating method, the vertical conducting parts 230 may be formed of, for example, a copper (Cu) material or a gold (Au) material to be abreast with one another at regular intervals.

The vertical conducting parts 230 and 232 are electrically connected to one another through the horizontal conducting parts 240 and 250. As shown in FIG. 2, each of the horizontal conducting parts 240 formed above an upper surface of the second substrate 290 connects a pair of conducting parts 230 of the vertical conducting parts 230 which are disposed in two rows to be abreast with one another, wherein the pair of vertical conducting parts 230 slantingly faces each other. Each of the horizontal conducting parts 250 formed on an upper surface of the second substrate 290 connects a pair of vertical conducting parts 230 of the vertical conducting parts 230 which belong to different rows and face each other. Thus, the vertical conducting parts 230 are electrically connected to one another through the horizontal conducting parts 240 and 250 to form the 3-D coil structure. The horizontal conducting parts 240 and 250 may also be formed using, for example, a plating method, a depositing method, etc. If the horizontal conducting parts 240 and 250 are formed using the plating method, the horizontal conducting parts 240 and 250 may be formed of, for example, a copper (Cu) material, a gold material (Au), etc. The horizontal conducting parts 240 and 250 connect the vertical conducting parts 230 to one another so as to form the 3-D coil structure. The horizontal conducting parts 240 and 250 alternately connect the vertical conducting parts 230 so as to form the 3-D coil structure.

The vertical conducting parts 232 are formed at both ends of the 3-D coil structure to support the 3-D coil structure, and the electrode parts 234 are provided underneath the vertical conducting parts 232. The electrode parts 234 are used to connect the micro antenna to a circuit (not shown) formed on the second substrate 290.

In the embodiment of FIG. 2, the electrode parts 234 are connected to ends of the separate vertical conducting parts 232, which support the 3-D coil structure, so as to be connected to the circuit of the second substrate 290.

Figure 3:
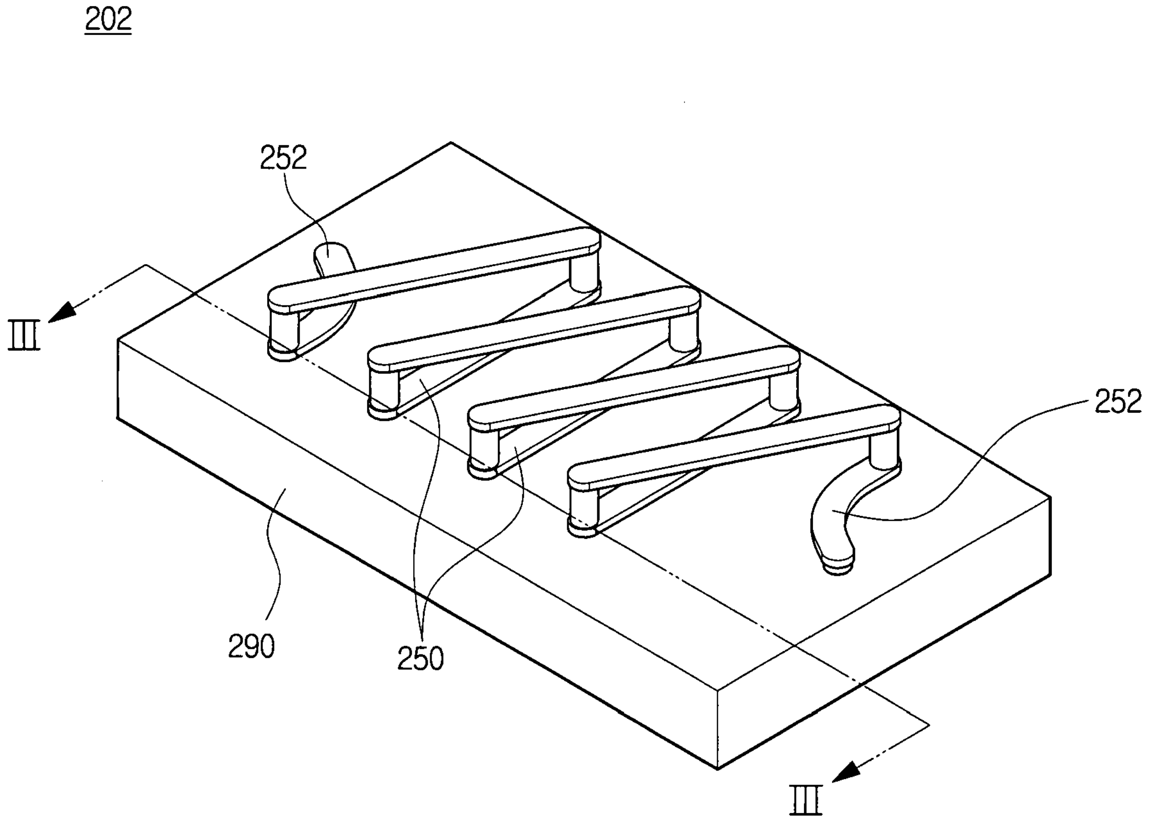

FIG. 3 is a perspective view illustrating a micro antenna according to another exemplary embodiment of the present invention. Different from the embodiment of FIG. 2, in the present embodiment, structures of horizontal conducting parts 250 are modified. In other words, in the present embodiment of FIG. 3, parts of the horizontal conducting parts 250 supporting a 3-D coil structure extend to form support horizontal conducting parts 252. If necessary, the horizontal conducting parts 250 may be connected to a circuit of the second substrate 290 through electrodes formed underneath the horizontal conducting parts 250.

A method of manufacturing a micro antenna will now be described in detail with reference to the accompanying drawings.

Figure 4A:
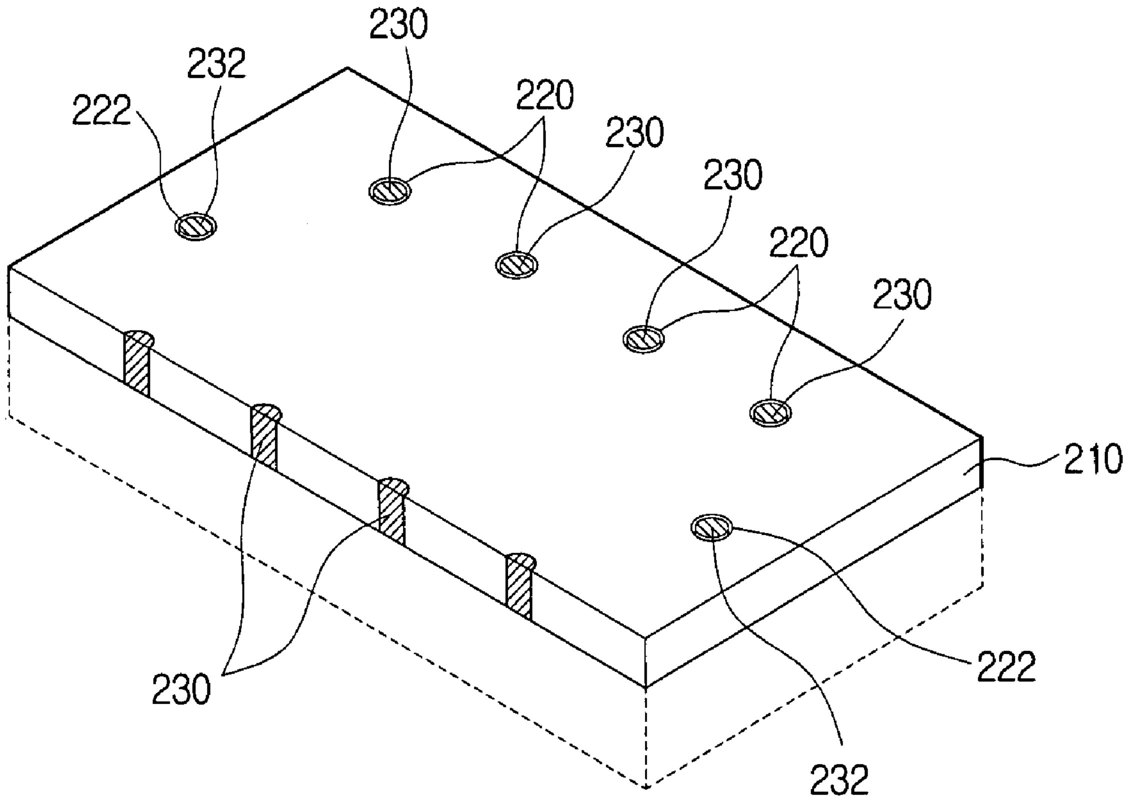
FIGS. 4A through 4C are partially cut perspective views illustrating a method of manufacturing a micro antenna according to an exemplary embodiment of the present invention.
Figure 4B:
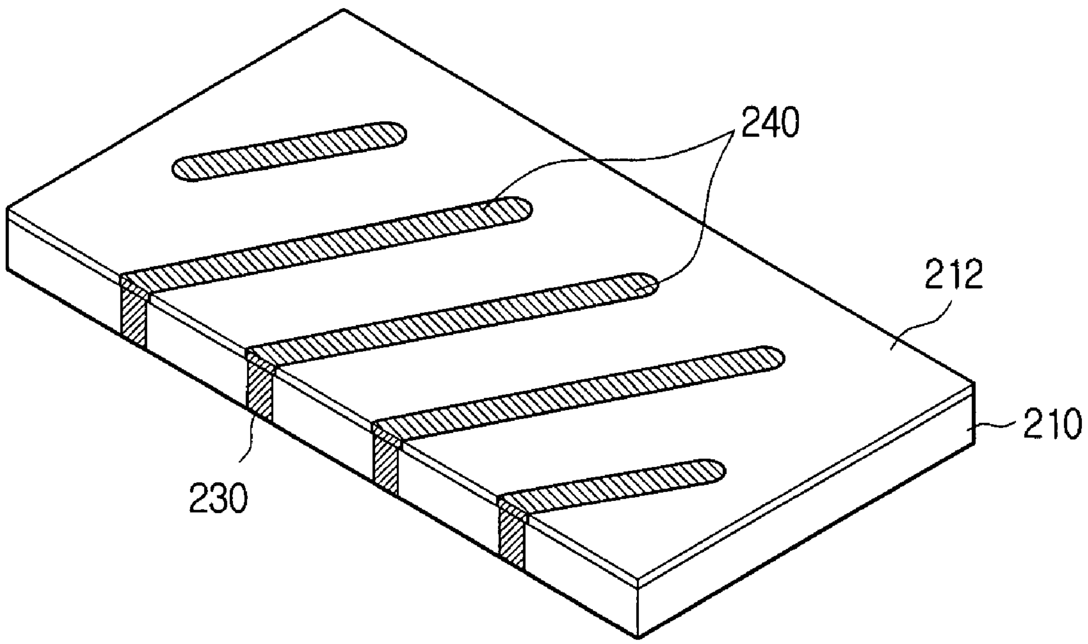
Figure 4C:
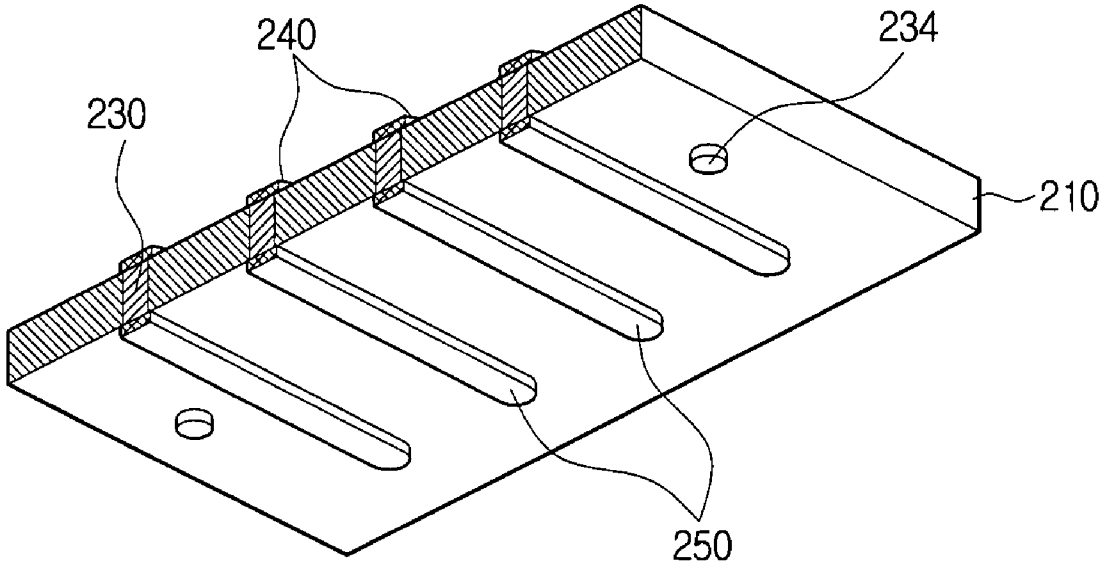

FIGS. 4A through 4D are partially cut perspective views illustrating a method of manufacturing a micro antenna according to an exemplary embodiment of the present invention. In particular, FIGS. 4A through 4C are partial perspective views cut along line I-I of FIG. 2.

Figure 4D:
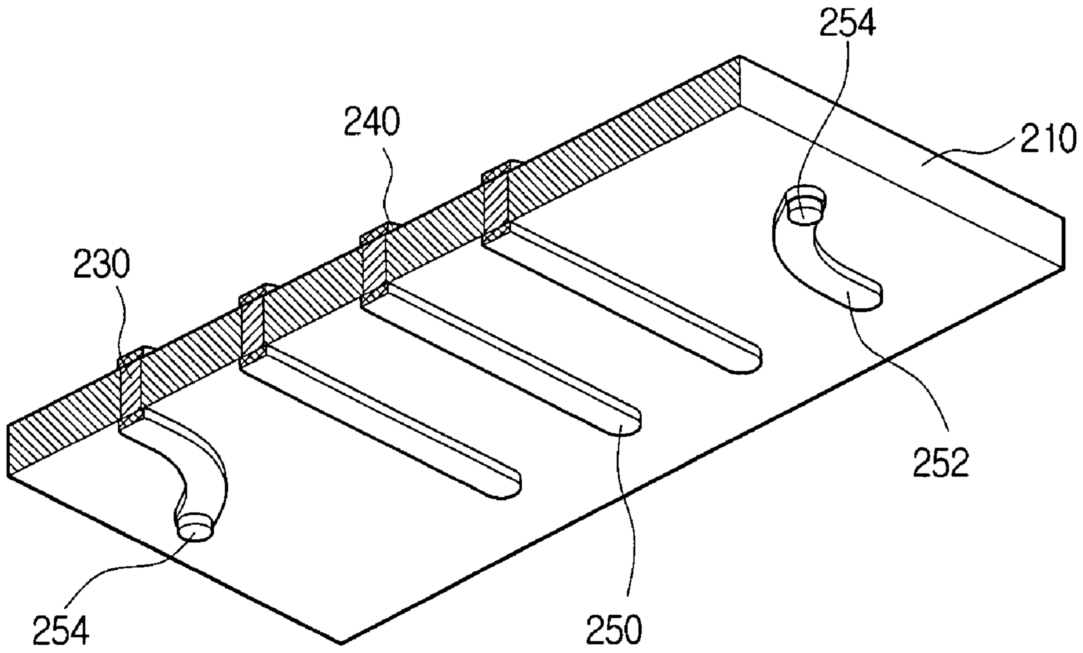
FIG. 4D is a partially cut perspective view illustrating a method of manufacturing a micro antenna according to another exemplary embodiment of the presenting invention.

FIG. 4D is a partially cut perspective view illustrating a method of manufacturing a micro antenna according to another exemplary embodiment of the present invention. In other words, a part of the micro antenna 202 of FIG. 3 cut along line III-III of FIG. 3 is shown in FIG. 4D.

Referring to FIG. 4A, a first substrate 210 is provided, and a plurality of holes 220 are formed in the first substrate 210 to penetrate the first substrate 210. In this case, the holes 220 may be disposed in two rows. The number of holes 220 formed in each of the two rows may be equal to each other, and the holes 220 may be formed at uniform intervals to face one another. Further holes 222 may be formed in both ends of the first substrate 210 separately from the holes 220 to form support vertical conducting parts 232.

A photolithography etching pattern process and a dry etching process may be mainly used to form the holes 220 and 222 in the first substrate 210. Here, the dry etching process may be performed using a photolithography etching pattern as a mask.

After the holes 220 and 222 are formed, a conductive material is filled in the holes 220 and 222. Thus, the support vertical conducting parts 232 are formed in the holes 222, and vertical conducting parts 230 are formed in the holes 220. A plating method may be used to form the vertical conducting parts 230 and the support vertical conducting parts 232. A part (unnumbered) marked with dotted lines underneath the first substrate 210 denotes a part removed before a process of forming the vertical conducting parts 230 and 232 and electrically connecting horizontal conducting parts 240 and 250 to one another is performed.

A portion of the first substrate 210 may be etched to protrude ends of the vertical conducting parts 230 and 232. In other words, the vertical conducting parts 230 and 232 must have a height the same as or higher than that of the first substrate 210 to be electrically connected to the horizontal conducting parts 240 and 250. Thus, a portion of the first substrate 210 may be etched to form such protrusions. Here, a well-known etching or planarizing method such as a chemical mechanical polishing (CMP) process may be used.

Referring to FIG. 4B, a first insulating pattern 212 is formed on an upper surface of the first substrate 210. Thus, pairs of the vertical conducting parts 230, which face one another in two lines on the upper surface of the first substrate, are connected to each other, wherein the pairs of the vertical conducting parts 230 are slantingly adjacent to each other in a diagonal direction. Also, the support vertical conducting parts 232, which support both ends of a structure formed on the first substrate 210, are connected to the other ones of the vertical conducting parts 230.

In detail, an insulating material may be stacked on the upper surface of the first substrate 210, and areas of the insulating material in which the horizontal conducting parts 240 are to be formed may be removed to form the first insulating pattern 212. Next, the removed areas of the insulating material may be plated on the first insulating pattern 212 to manufacture the horizontal conducting parts 240. Different from the exemplary embodiment illustrated in FIG. 4B, a metal layer may be stacked on the first substrate 210, and areas of the metal layer in which the horizontal conducting parts 240 are to be formed are left while other areas of the metal layer may be removed using a mask. As a result, only the horizontal conducting parts 240 may be manufactured without the first insulating pattern 212.

Pattern spaces for forming the horizontal conducting parts 240 are parallel with one another, and thus the horizontal conducting parts 240 are also parallel with the upper surface of the first substrate 210. Referring to FIG. 4B, upper parts of the vertical conducting parts 230 and 232 are electrically connected to one another through the horizontal conducting parts 240. The horizontal conducting parts 240 may be formed using a method such as a depositing method, a plating method, etc.

Referring to FIG. 4C, pattern spaces for forming the horizontal conducting parts 250 connecting the vertical conducting parts 230 facing one another are parallel with one another on a lower surface of the first substrate 210. Thus, the horizontal conducting parts 250 are parallel with one another on the lower surface of the first substrate 210. The horizontal conducting parts 250 may be formed using a depositing method, a plating method, etc. Lower parts of the vertical conducting parts 230 are electrically connected to one another through the horizontal conducting parts 250. The electrode parts 234 are formed underneath the vertical conducting parts 232 supporting the structure formed on the first substrate 210 so as to be positioned on each side of the horizontal conducting parts 250. The electrode parts 234 are bonded to electrode parts of the second substrate 290.

FIG. 4D is a perspective view illustrating a method of manufacturing a micro antenna according to another exemplary embodiment of the present invention. A part of the micro antenna 202 of FIG. 3 cut along line III-III of FIG. 3 is shown in FIG. 4D to be viewed from the lower surface of the first substrate 210. Portions of the horizontal conducting parts 250 extend to form the support horizontal conducting parts 252 at both ends of each of the horizontal conducting parts 250 so as to support the structure formed on the first substrate 210. If necessary, electrodes 254 may be additionally formed underneath the support horizontal conducting parts 252. The electrodes 254 are bonded to connection electrodes of the second substrate 290.

If the first substrate 210 including the 3-D coil structure in which the vertical conducting parts 230 as shown in FIGS. 4C and 4D, the horizontal conducting parts 240, and the horizontal conducting parts 250 are electrically connected to one another is completed, the first substrate 210 is bonded to the second substrate 290. After the first substrate 210 is completely bonded to the second substrate 290, dry or wet etching is performed to remove the first substrate 210 except for the 3-D coil structure. As a result, the micro antennas 200 and 202 are completely manufactured. In the micro antennas 200 and 202, the 3-D coil structure is formed on the second substrate 290 to have a square-like cross-section.

FIGS. 5A through 5E are cross-sectional views illustrating a method of manufacturing a micro antenna according to another exemplary embodiment of the present invention. For reference, the micro antenna according to the present exemplary embodiment also has a 3-D structure like the first substrate 210 illustrated in FIGS. 2, 3, and 4A through 4D. Cross-sectional views of FIGS. 5A through 5E illustrate a schematic 3-D structure. In other words, cross-sectional views of the micro antenna 200 taken along line II-II of FIG. 2 are shown in FIGS. 5A through 5E. These can be understood with reference to processes which will be described below.

Referring to FIGS. 5A through 5E, a first substrate 410 is manufactured in a 3-D structure and then bonded to a second substrate 490 using a method as illustrated in FIGS. 4A through 4D. Only a 3-D coil structure formed of a conductive material is left while the first substrate 410 is removed, so as to manufacture the micro antenna.

Figure 5A:
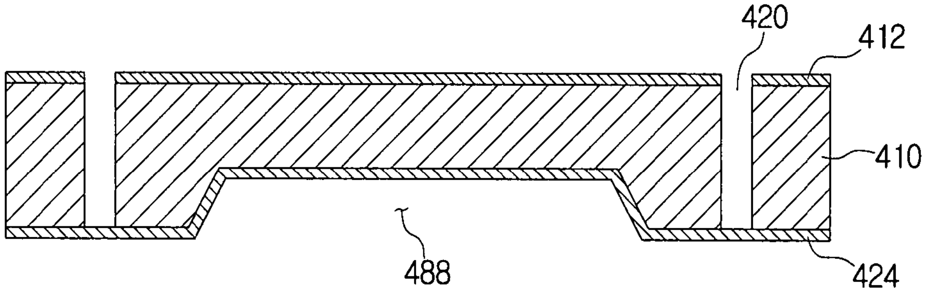
FIGS. 5A through 5E are cross-sectional views illustrating a method of manufacturing a micro antenna according to another exemplary embodiment of the present invention.

As shown in FIG. 5A, a cavity 488 is formed in a lower part of the first substrate 410. The cavity 488 operates to separate the 3-D coil structure manufactured on the first substrate 410 from the second substrate 490 so as to support the 3-D coil structure. The cavity 488 may be formed using a well-known etching method, and a depth of the cavity 488 may be adjusted according to an etching degree. The well-known etching method may be a wet or dry etching method for anisotropic or isotropic etching. For example, the well-known etching method may be a wet etching method using Tetra-Methyl Ammonium Hydroxide (TMAH).

After the cavity 488 is formed, a second seed metal layer 424 is formed on a lower surface of the first substrate 410. The lower surface of the first substrate 410 refers to a surface of the first substrate 410 positioned in a direction along which the first substrate 410 is to be bonded to the second substrate 490. The second seed metal layer 424 is a base layer of electroplating and thus may be generally formed of any material used for electroplating. In the present exemplary embodiment, the second seed metal layer 424 may be formed of, for example, Cr/Au or Ti/Cu which can be generally used in a semiconductor process.

Referring to FIG. 5A, a photolithography etching pattern 412 for forming holes 420 may be manufactured using a general process and include patterns for forming holes for vertical conducting parts disposed in two rows and the holes 420 for support vertical conducting parts, wherein the vertical conducting parts and the support vertical conducting parts are necessary for forming a 3-D coil structure. Although not shown, the number of holes disposed in each of the two rows may be equal to each other so that the holes in the first row face the holes in the second row at uniform intervals. In addition, the holes may be formed to be of a minimum size, and a number and a disposition of the holes may be selectively modified by those skilled in the art.

The photolithography etching pattern 412 on the first substrate 410 may be used as a mask to perform vertical etching using a dry etching process. As a result, the holes 420 may be formed in the first substrate 410 to vertically penetrate the first substrate 410. The vertical etching for forming the holes 420 is performed until the second seed metal layer 424 is exposed. After the holes 420 are completely formed, the photolithography etching pattern 412 on the first substrate 410 may be removed.

Figure 5B:
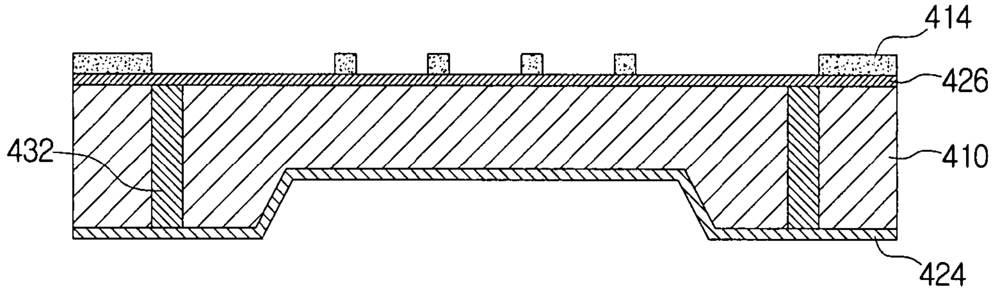

Referring to FIG. 5B, a conductive material is filled in the holes 420 to form vertical conducting parts (not shown) and support vertical conducting parts 432. A plating method may be used to form the vertical conducting parts and the support vertical conducting parts 432. In the present exemplary embodiment, an electroplating method may be used. In detail, the first substrate 410 is dipped into a solution including copper (Cu) or gold (Au) ions, and the second seed metal layer 424 is connected to a power source to perform plating. As a result, the holes 420 are filled with copper (Cu) or gold (Au) through the second seed metal layer 424.

After the holes 420 are filled using Cu or Au, portions of the first substrate 410 and the plated metal may be removed through a planarizing process to form the vertical conducting parts and the support vertical conducing parts 432.

Referring to FIG. 5B, after the vertical conducting parts and the support vertical conducting parts 432 are formed, a first seed metal layer 426 is formed on the first substrate 410. The first seed metal layer 426 may also be formed using Cr/Au or Ti/Cu.

A first photolithography etching pattern 414 is formed on the first seed metal layer 426. The first photolithography etching pattern 414 is used to form first horizontal conducting parts 440 and connects vertical conducing parts which are slantingly adjacent to one another on an upper surface of the first substrate 410. The first photolithography etching pattern 414 also includes pattern spaces corresponding to the vertical conducting parts. The first horizontal conducting parts 440 are formed by using electroplating, in portions of the pattern spaces exposed by the first photolithography etching pattern 414.

After the first horizontal conducting parts 440 are formed, portions of the first photolithography etching pattern 414 and the first seed metal layer 426 underneath the first photolithograph etching pattern 414 are removed.

Figure 5C:
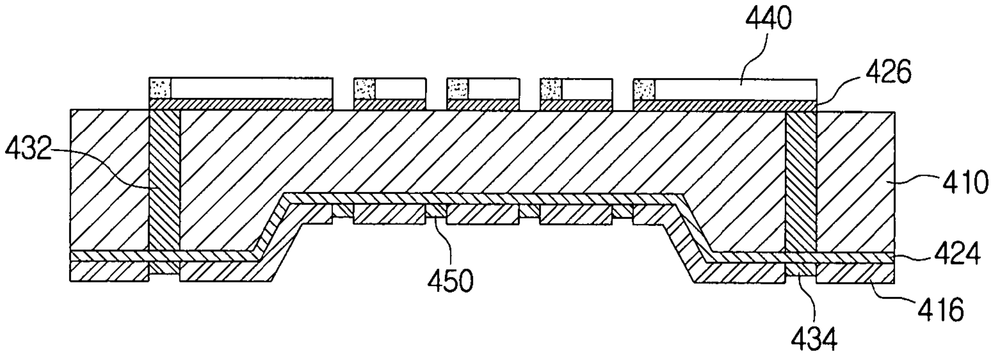

As shown in FIG. 5C, a second photolithography etching pattern 416 is formed underneath the second seed metal layer 424. The second photolithography etching pattern 416 are used to form second horizontal conducting parts 450 and grow a plated metal only in areas corresponding to the second horizontal conducting parts 450. For reference, in the present exemplary embodiment, electroplating is used. Thus, after seed metal layers are plated, the seed metal layers are removed according to patterns. However, if electroplating is performed, seed metal layers may be patterned to form seed metal patterns, and a plated metal may be grown through the seed metal patterns.

When the second horizontal conducting parts 450 are formed, connection electrode parts 434 may also be formed. In other words, the second horizontal conducting parts 450 may be formed in exposed portions of the second photolithography etching pattern 416, and the connection electrode parts 434 may be formed underneath the vertical conducting parts 432 supporting the 3-D coil structure. The connection electrode parts 434 are electrically bonded to the connection electrodes of the second substrate 490. The vertical conducting parts (not shown) and the support vertical conducting parts 432 are connected to the first horizontal conducting parts 440 through the second horizontal conducting parts 450 to form the 3-D coil structure.

Instead of forming the support vertical conducting parts 432 to support the 3-D coil structure, the second horizontal conducting parts 450 may be formed using the second photolithography etching pattern 416 and may extend to be electrically connected to the vertical conducting parts 430 so as to support the 3-D coil structure. In other words, the first and second horizontal conducting parts 440 and 450 may be modified into the form illustrated in FIG. 4D or into various other forms.

Figure 5D:
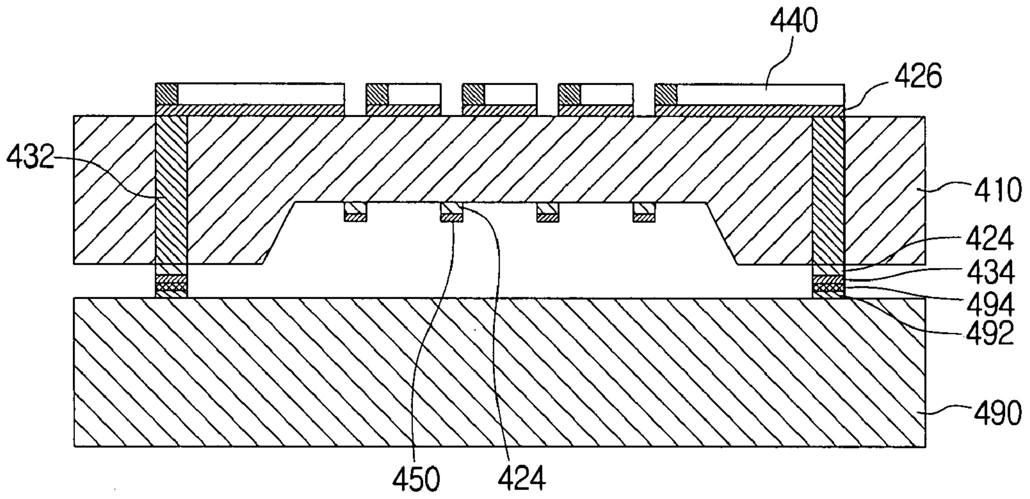

As shown in FIG. 5D, the second substrate 490 is bonded to the first substrate 410. Referring to FIG. 5D, the first substrate 410 includes the vertical conducting parts (not shown) and the support vertical conducting parts 432, the first and second horizontal conducting parts 440 and 450, and the electrode parts 434. Here, as previously described, the cavity 488 is formed in the lower part of the first substrate 410 to support the 3-D coil structure above the second substrate 490.

The electrode parts 434 provided underneath the first substrate 410 may be bonded to connection electrode parts 492 provided on the second substrate 490. In this case, the electrode parts 434 may be bonded to the connection electrode parts 492 through a bonding material 494.

The electrode parts 434 of the first substrate 410 are electrically connected to the 3-D coil structure. Although not shown in FIG. 5D, the connection electrode parts 492 of the second substrate 490 corresponding to the electrode parts 434 may be electrically connected to devices, an IC, etc. which may be formed on the second substrate 490. A process of stacking a material necessary for eutectic bonding may be additionally performed to bond the first substrate 410 to the second substrate 490. Also, a solder may be formed through a lift-off process, and then the first substrate 410 may be completely bonded to the second substrate 490 through a bonding process.

Figure 5E:
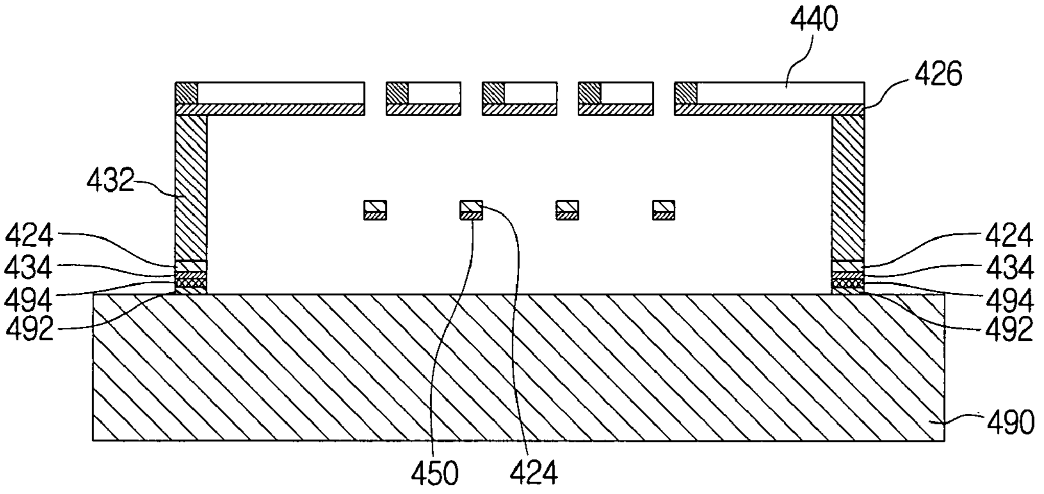

As shown in FIG. 5E, after the first substrate 410 is bonded to the second substrate 490, the first substrate 410 bonded to the second substrate 490 is removed using a dry or wet etching method using a photolithography etching pattern. As a result, the 3-D coil structure formed of a conductive material is exposed to form a micro antenna.

As described above, in a micro antenna and a method of manufacturing the micro antenna consistent with the present invention, the micro antenna can be easily micro-miniaturized using only a simple design and process. Other devices, an IC, etc. can be formed on a second substrate, and a 3-D coil structure can be formed on a first substrate. Next, the first substrate can be bonded to the second substrate, and then only the 3-D coil structure can be left while the first substrate can be removed. Thus, the micro antenna can be manufactured without affecting processes of manufacturing devices, an IC, etc. on the second substrate. Also, the micro antenna can be manufactured without damaging devices, an IC, etc. which have been formed on the second substrate.

A ratio of the micro antenna being poorly manufactured can be lowered. Also, a design of the micro antenna can be freely modified when dispositions and connections between devices, an IC, etc., and the micro antenna are required.

In addition, horizontal and vertical conducting parts can constitute the 3-D coil structure, and the 3-D coil structure can have a square-like cross-section. Also, the 3-D coil structure can lift from the second substrate. Thus, a high performance micro antenna capable of covering a frequency of a wide area can be realized through only a change of a design for adjusting a number of turns of the 3-D coil structure.

The foregoing embodiments and advantages are merely exemplary and are not to be construed as limiting the present invention. The present teaching can be readily applied to other types of apparatuses and methods. Also, the description of the exemplary embodiments of the present invention is intended to be illustrative, and not to limit the scope of the claims, and many alternatives, modifications, and variations will be apparent to those skilled in the art.

What is claimed is:

1. A method of manufacturing a micro antenna, comprising:

forming a plurality of holes penetrating a first substrate;

filling each of the plurality of holes with a conductive material to form a plurality of vertical conducting parts;

forming a plurality of horizontal conducting parts on each of two different surfaces of the first substrate, wherein the each of the plurality of horizontal conducting parts is electrically connected to the corresponding vertical conducting parts;

bonding the first substrate, on which the plurality of vertical conducting parts and the plurality of horizontal conducting parts have been formed, to a second substrate; and removing the first substrate to expose a whole structure of a 3D micro antenna which is formed on the second substrate, and comprises the plurality of vertical conducting parts and the plurality of horizontal conducting parts connected to each other.

2. The method of claim 1, wherein the conductive material is filled in the plurality of holes to form the plurality of vertical conducting parts.

3. The method of claim 2, wherein a plated metal is grown in the plurality of holes using plating, and then portions of the first substrate and an outer surface of the plated metal are removed using a planarizing process to form the plurality of vertical conducting parts.

4. The method of claim 1, wherein the formation of the plurality of horizontal conducting parts comprises:

forming a plurality of first horizontal conducting parts on an upper surface of the first substrate, wherein each of the plurality of first horizontal conducting parts is electrically connected to each of the plurality of vertical conducing parts; and forming a plurality of second horizontal conducting parts on a lower surface of the first substrate, wherein each of the plurality of second horizontal conducting parts is electrically connected to each of the plurality of vertical conducting parts.

5. The method of claim 4, wherein:

a first insulating pattern is formed on the upper surface of the first substrate and then used as a mask to form the plurality of first horizontal conducting parts on the upper surface of the first substrate; and a second insulating pattern is formed on the lower surface of the first substrate and then used as a mask to form the plurality of second horizontal conducting parts on the lower surface of the first substrate.

6. The method of claim 1, wherein the plurality of holes are formed in two rows in the first substrate to be abreast with one another.

7. The method of claim 4, wherein the plurality of holes are formed in two rows in the first substrate to be abreast with one another.

8. The method of claim 7, wherein:

pairs of vertical conducting parts, which belong to different rows and diagonally face each other, are electrically connected to each other on the upper surface of the first substrate;

pairs of vertical conducting parts, which belong to different rows and face one another, are electrically connected to one another on the lower surface of the first substrate to form a coil structure in which the plurality of vertical conducting parts, the plurality of first horizontal conducting parts, and the plurality of second horizontal conducting parts are electrically connected to one another.

9. The method of claim 7, wherein:

a first seed metal layer is formed on the upper surface of the first substrate, a first photolithography etching pattern is formed on the first seed metal layer, the first seed metal layer is plated using the first photolithography etching pattern as a mask to form the plurality of first horizontal conducting parts, and portions of the first photolithography etching pattern and the first seed metal layer exposed underneath the first photolithography etching pattern are removed;

a second seed metal layer is formed on the lower surface of the first substrate, a second photolithography etching pattern is formed on the second seed metal layer, and the second seed metal layer is plated using the second photolithography etching pattern as a mask to form the plurality of second horizontal conducting parts, and portions of the second photolithography etching pattern and the second seed metal layer exposed underneath the second photolithography etching pattern are removed.

10. The method of claim 1, before forming the plurality of holes in the first substrate, further comprising stacking a second seed metal layer on a lower surface of the first substrate.

11. The method of claim 10, wherein:

a photolithography etching pattern is formed on an upper surface of the first substrate and then used as a mask to perform dry etching from the upper surface of the first substrate to a seed metal layer so as to form the plurality of holes; and plating is performed through the seed metal layer to fill the plurality of holes with a conductive material so as to form the plurality of vertical conducting parts.

12. The method of claim 1, further comprising forming at least one connection electrode to bond the first substrate to the second substrate.

13. The method of claim 1, before forming the plurality of holes in the first substrate, further comprising forming a cavity in a lower part of the first substrate.

* * * * *